United States Patent [19]
Kashima et al.

[11] Patent Number: 5,801,590
[45] Date of Patent: Sep. 1, 1998

[54] DIELECTRIC RESONATOR OSCILLATOR AND DOWN CONVERTER USING THE SAME

[75] Inventors: Yukiro Kashima; Takayoshi Morino, both of Osaka, Japan

[73] Assignee: Matsushita Electric Industrial Co., Ltd., Osaka, Japan

[21] Appl. No.: 690,499

[22] Filed: Jul. 31, 1996

[30] Foreign Application Priority Data

Jul. 31, 1995 [JP] Japan ................ 7-195536

[51] Int. Cl.$^6$ ................ H03B 5/18; H04B 1/28
[52] U.S. Cl. ................ 331/68; 331/99; 331/117 D; 331/117 FE; 333/219.1; 455/318; 455/327
[58] Field of Search ................ 331/68, 67, 96, 331/99, 107 SL, 117 D, 117 FE; 333/219.1, 246, 247; 455/318, 325, 327

[56] References Cited

U.S. PATENT DOCUMENTS

| | | | |
|---|---|---|---|
| 4,435,688 | 3/1984 | Shinkawa et al. | 331/99 |
| 4,591,806 | 5/1986 | Havens | 331/96 |
| 4,618,836 | 10/1986 | Gannon et al. | 331/96 |
| 5,272,525 | 12/1993 | Borchardt et al. | 358/83 |

FOREIGN PATENT DOCUMENTS

| | | |
|---|---|---|
| 0 505 963 A2 | 9/1992 | European Pat. Off. . |
| 0 638 818 A1 | 2/1995 | European Pat. Off. . |
| 59-064904 | 4/1984 | Japan . |
| 60-025309 | 8/1985 | Japan . |
| 2-50605 | 2/1990 | Japan ................ 331/117 D |

Primary Examiner—Siegfried H. Grimm
Attorney, Agent, or Firm—Ratner & Prestia

[57] ABSTRACT

An oscillator circuit including a metal plate secured to a dielectric substrate. A micro strip line is mounted on the dielectric substrate. One end of the micro strip line is connected to the gate terminal of a field effect transistor for microwave oscillation and the other end of the micro strip line is grounded to the metal plate via a terminal resistor. A dielectric resonator is secured with an ordinary adhesive to the inner wall of a shield case. Attaching the dielectric resonator to the shield case allows the degree of coupling, defined by the distance between the micro strip line and the dielectric resonator, to be freely set. A tuning screw is screwed through the metal plate and the dieletric substrate opposite to the dielectric resonator. The microwave oscillation circuit can be used with a down converter.

7 Claims, 3 Drawing Sheets

DIELECTRIC RESONATOR OSCILLATOR AND DOWN CONVERTER USING THE SAME

FIELD OF THE INVENTION

The present invention relates to microwave oscillation circuits used in down converters of satellite broadcast and satellite communication and to down converters using the circuit.

BACKGROUND OF THE INVENTION

Recently, satellite broadcasts have become widespread and CS broadcasts utilizing a communication satellite have started. So chances receiving a plurality of satellites directly at a home are increasing. Accordingly, compactness and low cost of receiving antennas incorporating a down converter have been demanded.

Hereafter, a conventional microwave oscillation circuit used in a down converter of satellite broadcast and satellite communication will be illustrated referring to drawings.

FIG. 1(a) is an exploded perspective view showing the structure of a conventional microwave oscillation circuit, FIG. 1(b) is the 1b—1b section thereof. In FIG. 1(a) and FIG. 1(b), on metal plate 8, dielectric substrate 2 made of fluoride resin such as poly fluoride ethylene is disposed with its back surface securely contacted with metal plate 8. On the upper surface of dielectric substrate 2, field effect transistor (hereafter FET) 3 for microwave oscillation such as a metal semiconductor field effect transistor (hereafter MESFET) or a high electron mobility transistor (hereafter HEMT) is mounted. Also open stub 4, micro strip line 5, and the gate terminal 3g, drain terminal 3d, and source terminal 12 of FET 3 are formed on dielectric substrate 2.

Open stub 4 is connected with drain terminal 3d of FET 3. One end of micro strip line 5 is connected with gate terminal 3g of FET 3, the other end of micro strip line 5 is grounded via terminal resistor 6 and through hole 7 to metal plate 8. Oscillation output of FET 3 is output from source terminal 12.

Dielectric resonator 11 having a band rejection characteristic is secured by an adhesive via spacer 10 made of insulating material such as ceramics at a position adjacent to micro strip line 5 on dielectric substrate 2.

The space above dielectric substrate 2 is covered with shield case 1 made of metal such as aluminum die casting and shield case 1 is grounded to metal plate 8. Said circuit portion is electro-statically shielded by shield case 1 and metal plate 8.

A threaded aperture is provided in shield case 1, and screw 9 for fine adjusting of oscillation frequency is screwed therein. screw 9 is closely opposing to dielectric resonator 11.

The operation of the microwave oscillation circuit constituted as described above will be illustrated referring to FIG. 1(a) and FIG. 1(b). Drain terminal 3d of FET 3 for microwave oscillation mounted on dielectric substrate 2 is grounded in terms of high frequency by open stub 4. By connecting micro strip line 3 whose one end is connected with gate terminal 3g and the other end is grounded to metal plate 8 via terminal resistor 6 and through hole 7 and dielectric resonator 11 having a band rejection characteristic, FET 5 oscillates and a stable oscillation frequency output is obtained from source terminal 12 of FET 3 for microwave oscillation. By rotating screw 9 provided in shield case 1 to change the distance to dielectric resonator 11, the oscillation frequency can be finely adjusted.

However, as for the conventional structure, fluoride resin such as poly fluoride ethylene showing a small high frequency loss is often used as a material of dielectric substrate 2 of an oscillation circuit used in a microwave band especially 10 GHz band. Special pre-treatment of adhering surface of the fluoride resin such as poly fluoride ethylene by using a chemical such as metal sodium is needed to adhere ceramic spacer 10 onto dielectric substrate 2, and ordinary adhesives can't give sufficient adhesive strength, so, good production efficiency and low cost cannot be obtained.

Also, due to the limit of physical dimension between micro strip line 5 and spacer 10, that is, spacer 10 has to be kept away from micro strip line 5, so that the center of dielectric resonator 11 is kept away by the radius of spacer 10 from micro strip line 5. Accordingly, degree of coupling which is an important factor defining stability of the oscillation and the oscillation output and defined by the distance between micro strip line 5 and dielectric resonator 11 cannot be set freely.

SUMMARY OF THE INVENTION

The first object of the invention is to eliminate the special pre-treatment for adhering a spacer for supporting a dielectric resonator onto a dielectric substrate to enhance the production efficiency and reduce the cost. The second object is to freely set degree of coupling defined by the distance between micro strip line 5 and dielectric resonator 11. And a microwave oscillation circuit and a down converter incorporating the microwave oscillation circuit which are low in the cost and high in the reliability will be offered.

A microwave oscillation circuit of the invention, to achieve above objects, comprises: a metal plate; a dielectric substrate whose back surface is surely contacting to said metal plate; FET for microwave oscillation whose drain terminal is grounded in terms of high frequency by an open stub; micro strip line provided on said dielectric substrate whose one end is connected with gate terminal of said FET for microwave oscillation and the other end is grounded to said metal plate via a terminal resistor and a through hole; a shield case for shielding the circuit on the said dielectric substrate; a dielectric resonator having a band rejection characteristic secured on the inner wall of said shield case; wherein said micro strip line on said dielectric substrate and said dielectric resonator are coupled, and by changing the distance between a screw engaging with a threaded aperture in said metal plate penetrating said dielectric substrate and said dielectric resonator, the oscillation frequency is finely adjusted, the oscillation frequency output is obtained from a source terminal of said FET for microwave oscillation.

A down converter of the invention employs a microwave oscillation circuit constituted as described above, and the oscillation frequency output from the source terminal of the FET for microwave oscillation in said microwave oscillation circuit is passed through a band pass filter to output as a local oscillation frequency output. The local oscillation frequency output is mixed with an input signal at a diode for converting frequency so that the input signal is converted to an intermediate frequency.

As for the present invention, a dielectric resonator to be coupled with a micro strip line is secured on a shield case through a spacer through the above structure. Therefore, a special pre-treatment is not needed different from the conventional method in which a spacer is fixed on a dielectric substrate such as polyfluoride etylene. The spacer can be fixed using an ordinary adhesive (such as an epoxy adhesive). Accordingly a microwave oscillation circuit and a down converter for receiving satellite waves of high productivity, low cost, and high reliability can be realized.

Moreover, as the dielectric resonator can be set at an arbitrary position above the micro strip line, a desired degree of coupling can be obtained.

EMBODIMENTS OF THE INVENTION

Figure 2A:
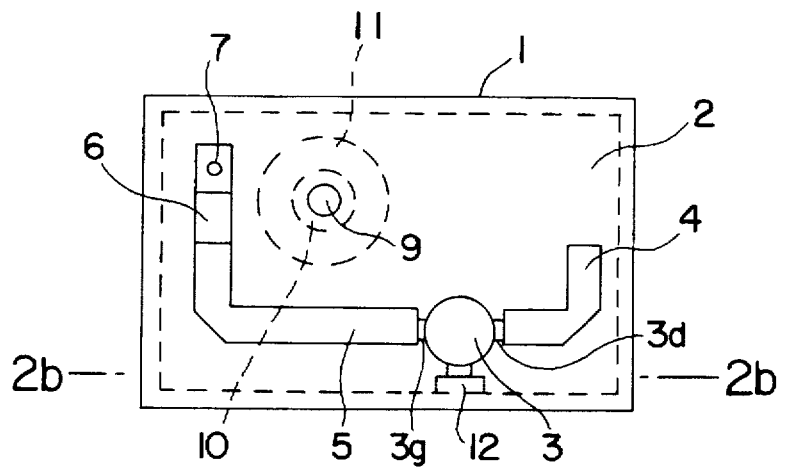
FIG. 2(a) is a plane view showing the structure of a microwave oscillation circuit of an embodiment of the invention.

FIG. 2(a) is a plane view showing the structure of a microwave oscillation circuit of an embodiment of the invention.

Figure 1A:
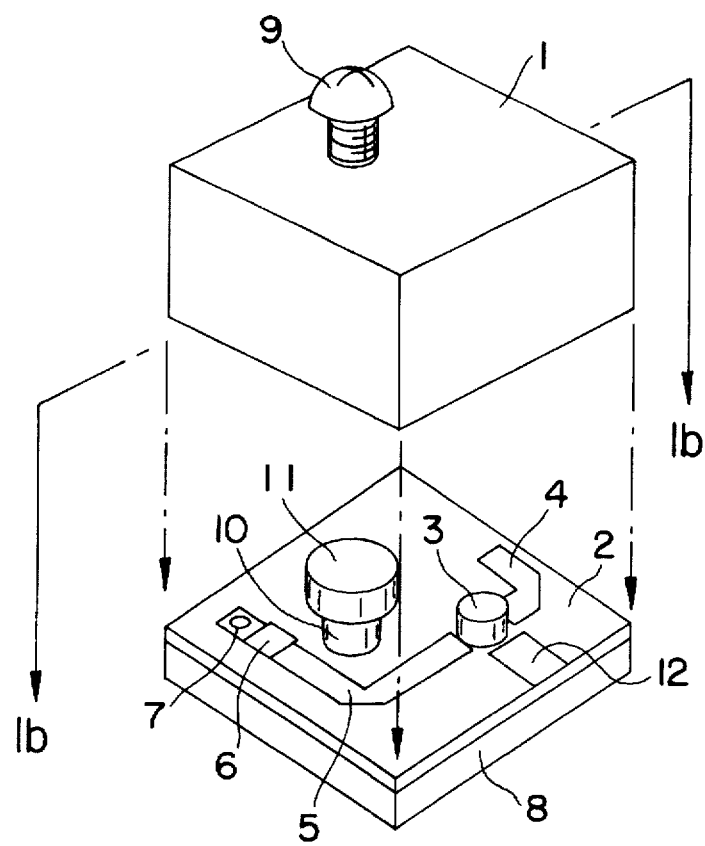
FIG. 1(a) is an exploded perspective view showing the structure of a conventional microwave oscillation circuit.
Figure 1B:
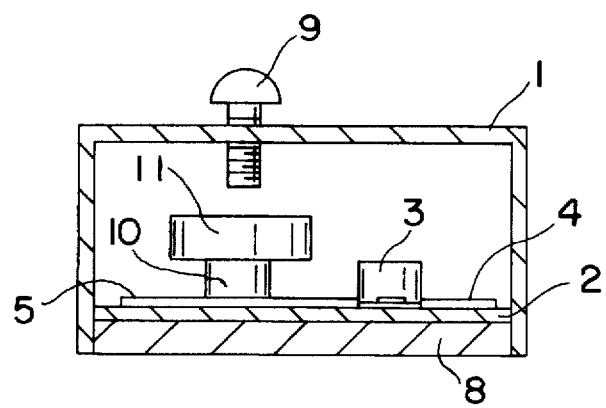
FIG. 1(b) is the 1b—1b section thereof.
Figure 2B:
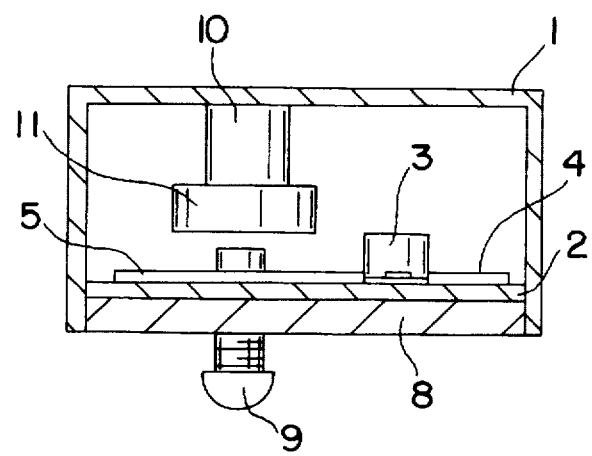
FIG. 2(b) is the 2b—1b section thereof.

FIG. 2(b) is the 2b—2b section thereof. The same members as in the conventional example in FIGS. 1(a) and 1(b) are attached with the same numbers.

In FIG. 2(a) and FIG. 2(b), on metal plate 8, dielectric substrate 2 made of fluoride resin such as poly fluoride ethylene is disposed with its back surface securely contacted with metal plate 8. On the upper surface of dielectric substrate 2, FET 3 for microwave oscillation such as MES-FET or HEMT is mounted. Also open stub 4, micro strip line 5, and the gate terminal 3g, drain terminal 3d, and source terminal 12 of FET 3 are formed on the upper surface of dielectric substrate 2.

Open stub 4 is connected to drain terminal 3d of FET 3. One end of micro strip line 5 is connected with gate terminal 3g of FET 3. The other end of micro strip line 5 is grounded via terminal resistor 6 and through hole 7 to metal plate 8. Oscillation output of FET 3 is output from source terminal 12.

The space above dielectric substrate 2 is covered with shield case 1 made of metal such as aluminum die casting and shield case 1 is grounded to metal plate 8. The oscillator circuit is electro-statically shielded by shield case 1 and metal plate 8.

The portions different from the conventional example in FIG. 1(a) and 1(b) are as follows.

Dielectric resonator 11 having a band rejection characteristic is secured by an ordinary adhesive which needs no special pre-treatment (for example an epoxy system resin material) via spacer 10 at the position on the inner wall opposite dielectric substrate 2.

Screw 9 for fine adjusting of oscillation frequency is disposed In metal plate 8. Screw 9 engages with a threaded aperture provided in metal plate 8 penetrating dielectric substrate 2 and opposite to dielectric resonator 11. Screw 9 can thus vary the distance to dielectric resonator 11.

The operation of a microwave oscillation circuit constituted as described above will be illustrated referring to FIGS. 2(a) and 2(b). Coupling dielectric resonator 11 and micro strip line 5 and rotating screw 9 to vary the distance between the screw and dielectric resonator 11, fine adjusting of an oscillation frequency is performed and a stable oscillation frequency output can be obtained from the source terminal 12 of FET 3 for microwave oscillation.

As for the embodiment, a dielectric resonator to be coupled with a microwave strip line provided on a dielectric substrate in the prior art is provided on a shield case side. Therefor, when it is secured via a spacer, there is no need for a special pre-treatment as seen in the conventional example in which the dielectric resonator is secured on a dielectric substrate made of fluoride resin such as poly fluoride ethylene. Accordingly, very high productivity, low cost, and high reliability of the microwave oscillation circuit can be realized. Moreover, as the dielectric resonator is secured to a shield case, there is no need for placing it adjacent to the micro strip line as seen in the conventional example, and it can be set at an arbitrary position above the micro strip line, so that a desired degree of coupling can be obtained.

Here, in the embodiment, spacer 10 and dielectric resonator 11 are described as they are provided on a inner wall of shield case 1 opposite to dielectric substrate 2 though, it is needless to say that a similar effect can be obtained by providing them on the side wall of the shield case.

Figure 3:
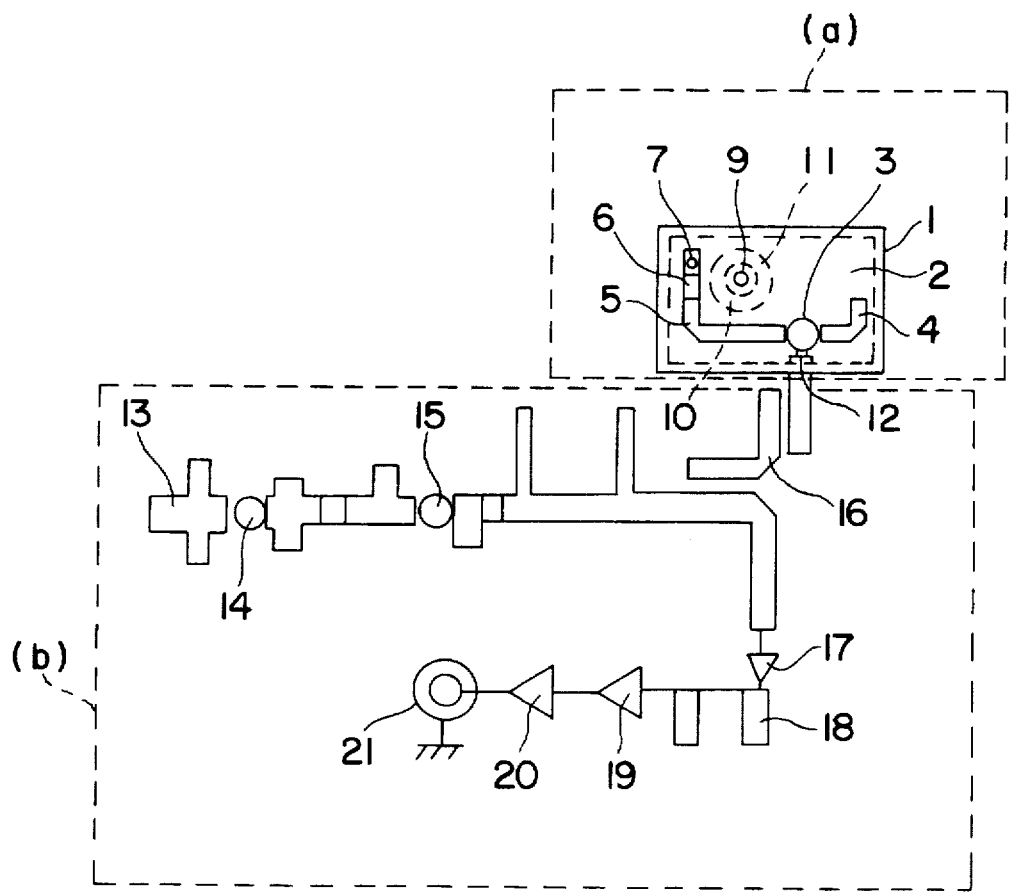
FIG. 3 is a block diagram of a down converter employing a microwave oscillation circuit of the invention.

FIG. 3 shows a circuit configuration of a down converter in an embodiment of the invention. Reference numerals of the members of the microwave oscillation circuit surrounded by the broken line (a) in FIG. 3 correspond to those of FIG. 2(a). The down converter surrounded by the broken line (b) in FIG. 3 is, for example, a down converter for receiving satellite waves. In FIG. 3, 13 is a microwave signal input circuit, 14 and 15 are low noise amplifiers, 16 is a band pass filter, 17 is diode for frequency conversion, 18 is a low pass filter, 19 and 20 are intermediate frequency amplifiers, 21 is an intermediate frequency signal output terminal.

The operation of a down converter for receiving a satellite wave of the invention will be illustrated referring to FIG. 3. The operation of microwave oscillation circuit (a) is the same as illustrated in FIG. 2, and a stable local oscillation frequency output (for example 11.2 GHz) is obtained. The local oscillation frequency output is applied to diode 17 for frequency conversion through band pass filter 16. On the other hand, a signal of 12 GHz band (for example 11.75 GHz–12.75 GHz) input to microwave signal input circuit 13 is amplified by low noise amplifiers 14 and 15 and mixed with the local oscillation frequency output at diode 17 for frequency conversion to be converted to an intermediate frequency of 1 GHz band. The signal converted to the intermediate frequency of 1 GHz band is passed through low pass filter 18 and amplified to a desired level by intermediate frequency amplifiers 19 and 20 and output from intermediate frequency signal output terminal 21.

These numerics used in the embodiments are examples, and are not intended limits of the invention.

As illustrated above, according to the invention, a dielectric resonator to be coupled with a micro strip line connected to the gate terminal of an FET for microwave oscillation provided on a dielectric substrate is secured on a shield case opposite to the dielectric substrate through a spacer by adhering. Therefore, there is no need for a special pre-treatment for adhering a dielectric resonator to a dielectric substrate through a spacer as in the prior art, and ordinary adhesives can be used for that. Thus the problems of the productivity and the cost can be solved, and the degree of coupling defined by the distance between the micro strip line and the dielectric resonator can be set freely. A microwave oscillation circuit which is low in cost and high in reliability and a down converter equipped with this microwave resonator can be realized.

What is claimed is:

1. A microwave oscillation circuit comprising:

a metal plate, said metal plate having a screw hole;

a dielectric substrate having a surface securely contacting said metal plate;

a field effect transistor for microwave oscillation mounted on said dielectric substrate, a drain-terminal of said field effect transistor grounded in terms of high frequency by an open stub;

a micro strip line provided on said dielectric substrate, one end of said micro strip line connected with a gate terminal of said field effect transistor for microwave oscillation and the other end grounded to said metal plate via a terminal resistor;

a shield case for shielding the circuit on said dielectric substrate;

a dielectric resonator having a band rejection characteristic secured by an adhesive on an inner wall of said shield case; and a tuning screw coupled to said screw hole of said metal plate, said tuning screw penetrating said dielectric substrate;

wherein said micro strip line on said dielectric substrate and said dielectric resonator are coupled and an oscillation frequency output is obtained from the source terminal of said field effect transistor for microwave oscillation and the oscillation frequency is adjusted by rotating said tuning screw and varying a distance between said tuning screw and said dielectric resonator.

2. A microwave oscillation circuit according to claim 1, wherein said metal plate has a greater thickness than said shield case.

3. A microwave oscillation circuit of claim 1 coupled to a down converter so the oscillation frequency is output through a band pass filter and the output is mixed with an input signal at a diode for frequency conversion to convert the input signal to an intermediate frequency.

4. A microwave oscillation circuit of claim 3 wherein said dielectric resonator is secured on an inner wall of said shield case opposite said dielectric substrate using a spacer.

5. A microwave oscillation circuit of claim 3 further comprising a screw engaging a threaded aperture in said metal plate and penetrating said dielectric substrate for fine tuning the oscillation frequency by changing the distance between said screw and said dielectric resonator.

6. A microwave oscillation circuit comprising:

a metal plate having a first surface, a second surface and a screw hole penetrating said first and second surfaces;

a dielectric substrate having a surface securely contacting said second surface of said metal plate;

field effect transistor for generating a microwave oscillation mounted on said dielectric substrate, said field effect transistor having at least a gate terminal and a source terminal;

a micro strip line provided on said dielectric substrate, a first end of said micro strip line connected with the gate terminal of said field effect transistor and a second end of said micro strip line grounded to said metal plate via a terminal resistor, forming a circuit on said dielectric substrate;

a shield case for shielding the circuit on said dielectric substrate;

a dielectric resonator secured on an inner wall of said shield case; and a tuning screw coupled to said screw hole at said first surface of said metal plate, said tuning screw penetrating said metal plate and said dielectric substrate;

wherein said micro strip line and said dielectric resonator are coupled and an oscillation frequency output is obtained from the source terminal of said field effect transistor and the oscillation frequency is adjusted by rotating said tuning screw to i) penetrate said dielectric substrate and ii) vary a distance between said tuning screw and said dielectric resonator.

7. A microwave oscillation circuit according to claim 6, wherein said metal plate has a greater thickness than said shield case.

* * * * *

UNITED STATES PATENT AND TRADEMARK OFFICE
CERTIFICATE OF CORRECTION

PATENT NO. : 5,801,590
DATED : September 1, 1998
INVENTOR(S) : Kashima et al.

It is certified that error appears in the above-identified patent and that said Letters Patent is hereby corrected as shown below:

Cover page, item [75] Inventors, "Takayoshi Morino of Osaka, Japan" should be --Takayoshi Morino of Kanagawa, Japan--.

Cover page, item [56] References Cited, Foreign Patent Documents, "60-025309 8/1985 Japan" should be --60-025308 8/1985 Japan--.

Column 6, line 12, before "field" insert --a--.

Signed and Sealed this

Thirtieth Day of March, 1999

Attest:

Q. TODD DICKINSON

*Attesting Officer*    *Acting Commissioner of Patents and Trademarks*